United States Patent [19]

Oda et al.

[11] Patent Number: 5,227,745
[45] Date of Patent: Jul. 13, 1993

[54] LINE FILTER ASSEMBLY

[75] Inventors: Toshinori Oda, Hirakata; Shunji Hashimoto, Kadoma; Tatsuya Mori, Katano, all of Japan

[73] Assignee: Matsushita Electric Industrial Co., Ltd., Osaka, Japan

[21] Appl. No.: 876,341

[22] Filed: Apr. 30, 1992

Related U.S. Application Data

[63] Continuation of Ser. No. 716,510, Jun. 17, 1991, Pat. No. 5,155,457.

[30] Foreign Application Priority Data

| Jun. 18, 1990 | [JP] | Japan | 2-159016 |
| Aug. 31, 1990 | [JP] | Japan | 2-231723 |
| Jan. 25, 1991 | [JP] | Japan | 3-001912 |
| Jan. 25, 1991 | [JP] | Japan | 3-001914 |
| Jan. 25, 1991 | [JP] | Japan | 3-001915 |
| Jan. 25, 1991 | [JP] | Japan | 3-119193 |
| Jan. 29, 1991 | [JP] | Japan | 3-002315 |
| Jan. 29, 1991 | [JP] | Japan | 3-008889 |

[51] Int. Cl.⁵ ............................................. H03H 7/00
[52] U.S. Cl. ...................................... 333/177; 333/176; 333/167; 336/69; 336/210; 336/185
[58] Field of Search ............... 333/177, 176, 167, 175, 333/180, 178; 336/182, 184, 210, 185, 198, 192, 180, 208, 69, 181

[56] References Cited

U.S. PATENT DOCUMENTS

| 4,945,332 | 7/1990 | Sakamoto et al. | 333/177 X |
| 5,023,585 | 6/1991 | Kurano et al. | 336/210 X |
| 5,155,457 | 10/1992 | Oda et al. | 333/177 |

Primary Examiner—Robert J. Pascal
Assistant Examiner—Ali Neyzari
Attorney, Agent, or Firm—Wenderoth, Lind & Ponack

[57] ABSTRACT

A line filter assembly adapted to be inserted in an electrical power supply circuit of various electronic appliances for avoiding an invasion and leakage of noise include first and second core members each having a pair of opposite arms connected together through a common bridge. Coils are formed on the arms of each of the core members in such a manner that directions of magnetic fluxes produced in the closed magnetic circuit as a result of flow of line currents counteract while the same coils are so arranged that the magnetic fluxes produced in the closed magnetic circuit as a result of the flow of the line currents are oriented in the same direction.

4 Claims, 6 Drawing Sheets

LINE FILTER ASSEMBLY

This is a continuation application of Ser. No. 07/716,510, filed Jun. 17, 1991 now U.S. Pat. No. 5,155,457.

BACKGROUND OF THE INVENTION

1. Field of the Invention

The present invention relates to a line filter assembly for use in an electrical power supply circuit in an electronic appliance for avoiding an invasion and/or a leakage of noise.

2. Description of the Prior Art

A line filter assembly is known to be used to predominantly prevent a common-mode noise component which tends to be generated between a pair of lines and the ground in an electrical power supply circuit. The line filter assemblies hitherto used are generally constructed as shown in FIG. 1 which illustrates an electrical equivalent circuit. As shown in FIG. 1, the line filter assembly comprises a magnetic core assembly 1 forming a closed magnetic circuit in which magnetic fluxes are produced by a line current. In order to avoid a magnetic saturation of the core assembly 1, coils 2 and 3 are wound on opposite portions of the core assembly 1 so that the magnetic fluxes produced by the line current can counteract each other.

More specifically, one specific type of prior art line filter assembly is shown in FIG. 2. The illustrated line filter assembly comprises an open-ended bobbin 4 made of synthetic resin and having first and second coils 2 and 3 wound therearound, and a core assembly 1 including a pair of generally U-shaped core members each made of, for example, ferrite, and having a pair of arms opposite to each other and connected together by means of a bridge. The bobbin 4 with the coils 2 and 3 thereon is mounted on the core assembly with the perspective arms of the core members inserted into the hollow of the bobbin 4 while the free ends of the arms of the core members are held in abutment with each other. After the mounting of the bobbin on the core assembly in the manner described above, a metal clamp 5 prepared from a strip of stainless steel is disposed to embrace the core members together so as to thereby complete the line filter assembly.

In a different type of the prior art line filter assembly shown in FIG. 3, the core assembly 1 is of a generally 日-shaped configuration made of, for example, ferrite and having an intermediate arm transversing the perimeter of the core assembly 1. Bobbin halves, which form a bobbin 6 when assembled together, are mounted on the intermediate arm from opposite directions to complete the bobbin 6 onto which the first and second coils 2 and 3 subsequently formed by rotating the bobbin 6 about the intermediate arm in the core assembly 1 so as to thereby complete the line filter assembly.

In any one of the illustrated prior art line filter assemblies, since the two coils 2 and 3 are formed on one arm of the core assembly 1 forming the closed magnetic circuit, a space allocated for each coil is so small that the cross-sectional surface area of the coil assembly 1 must be increased or the use of the arm of increased length is necessitated for the line filter assembly to provide a high inductance. Thus, the prior art line filter assemblies have a problem associated with a space factor and, therefore, cannot be manufactured in a reduced size.

While the prior art line filter assembly shown in FIG. 3 is effective to give a high inductance because of the core assembly being of a structure forming the completely closed magnetic circuit, the intermediate arm employed in the generally 日-shaped core assembly 1 cannot be formed so as to have a round cross-section because of the complicated shape thereof and a space is required between the bobbin 6 and the intermediate arm so that the bobbin 6 can rotate thereabout during the winding of wires to form the coils 2 and 3. The presence of the space between the bobbin 6 and the intermediate arm of the core assembly 1 tends to hamper a manufacture of the line filter assembly in a compact size and having a reduced height.

SUMMARY OF THE INVENTION

Accordingly, the present invention has been devised with a view to substantially eliminating the above discussed problems inherent in the prior art line filter assemblies and is intended to provide an improved line filter assembly which can be manufactured in a compact size having a reduced height.

In order to accomplish the foregoing object, the present invention provides a line filter assembly adapted to be inserted in an electrical power supply circuit of various electrical appliances for avoiding an invasion and leakage of noise comprises first and second core members each having a pair of opposite arms connected together through a common bridge. Coils are formed on the arms of each of the core members in such a manner that directions of magnetic fluxes produced in the closed magnetic circuit as a result of flow of line currents counteract while the coils are so arranged that the magnetic fluxes produced in the closed magnetic circuit as a result of the flow of the line currents are oriented in the same direction.

With the foregoing construction, the magnetic coupling of the paired coils can be increased, resulting in a minimized possibility of the magnetic saturation taking place in the core assembly during the flow of the line current. Also, the core members forming the closed magnetic circuit may be small in size for the resultant line filter assembly to give a high inductance and, therefore, the line filter assembly as a whole can be manufactured compact in size, low in height and at a reduced manufacturing cost.

BRIEF DESCRIPTION OF THE DRAWINGS

This and other objects and features of the present invention will become clear from the following description taken in conjunction with preferred embodiments thereof with reference to the accompanying drawings, in which.

DETAILED DESCRIPTION OF THE EMBODIMENTS

Figure 1:
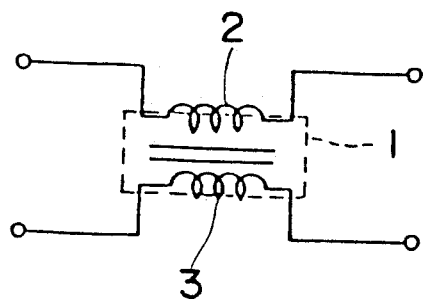
FIG. 1 is an equivalent circuit diagram of the prior art line filter assembly.
Figure 2:
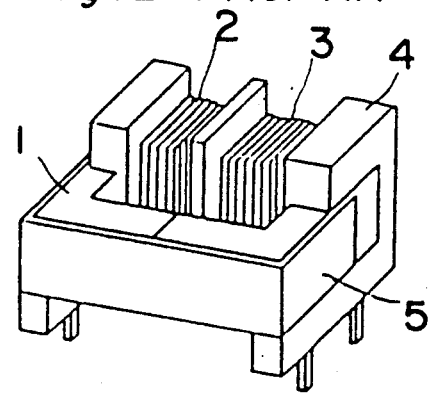
FIG. 2 is a schematic perspective view of the prior art line filter assembly.
Figure 3:
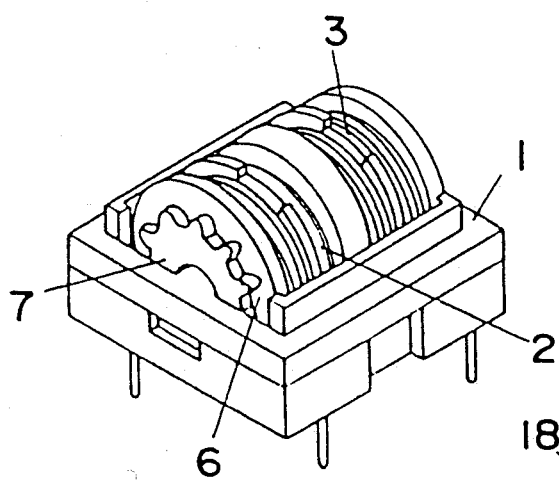
FIG. 3 is a schematic perspective view of the different prior art line filter assembly.

Before the description of the present invention proceeds, it is to be noted that like parts are designated by like reference numerals throughout the accompanying drawings except for FIGS. 1 to 3 to which the prior art pertains.

First Embodiment

Figure 4:
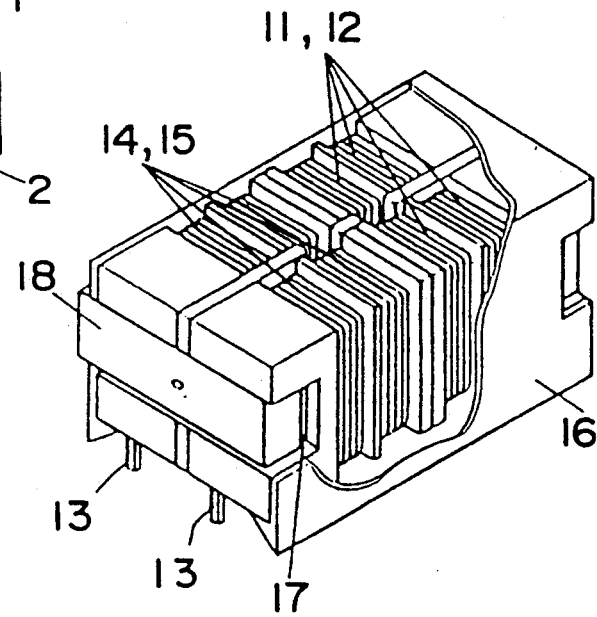
FIG. 4 is a perspective view, with a portion cut away, of a line filter assembly according to a first preferred embodiment of the present invention.
Figure 5:
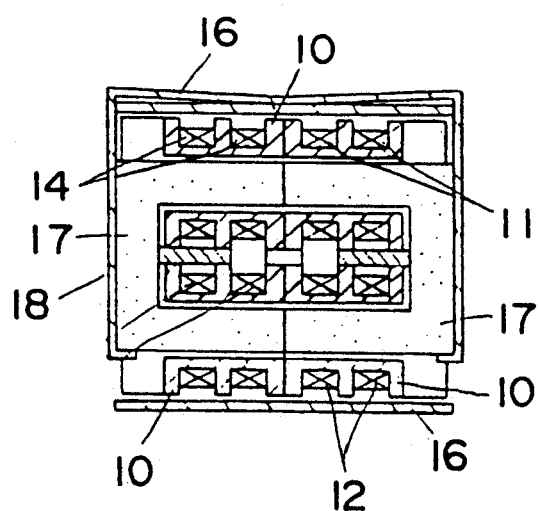
FIG. 5 is a sectional view of the line filter assembly of FIG. 4.
Figure 6:
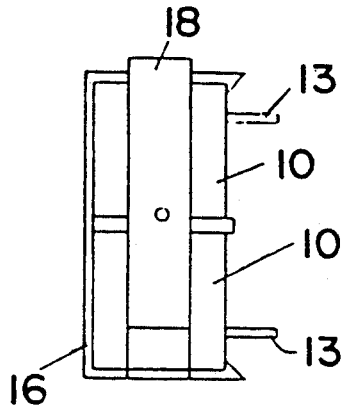
FIG. 6 is a side view of the line filter assembly of FIG. 4.
Figure 7:
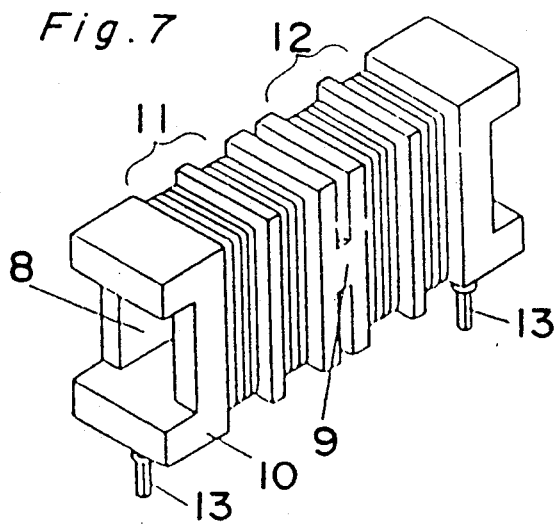
FIG. 7 is a perspective view of one coil bobbin assembly used in the line filter assembly of FIG. 4.

FIGS. 4 to 6 pertain to a first preferred embodiment of the present invention. FIG. 4 is a schematic perspective view, with a portion cut away, of a line filter assembly; FIG. 5 is a sectional view thereof; and FIG. 6 is a side view thereof. In FIG. 7, there is shown a multi-linked winding bobbin assembly made of synthetic resin. The multi-linked winding bobbin assembly shown therein comprises first and second bobbins 10 which have respective hollows 8 defined therein and are linked together in an in-line fashion by means of a thin-walled portion 9 of 0.5 to 2 mm in wall thickness. A copper wire having its peripheral surface coated with an electrically insulating material is wound around the first bobbin 10 so as to extend from one end of the first bobbin 10 towards the opposite end thereof adjacent the thin-walled portion 9 thereby to form a first coil 11, and then around the second bobbin 10 so as to extend from one end of the second bobbin 10 adjacent the thin-walled portion 9 towards the opposite end thereof thereby to form a second coil 12. The copper wire so wound around the multi-linked winding bobbin assembly has its opposite ends soldered to respective metallic terminal members 13 secured rigidly to the first and second bobbins 10.

Third and fourth coils 14 and 15 are also formed on another multi-linked winding bobbin assembly of similar construction in a similar manner as shown in FIG. 7. However, the direction of turn of the copper wire used to form the third and fourth coils 14 and 15 is opposite to the direction of turn of the copper wire used to form the first and second coils 11 and 12, while the total number of turns of the third and fourth coils 14 and 15 is equal to that of the first and second coils 11 and 12.

Figure 8:
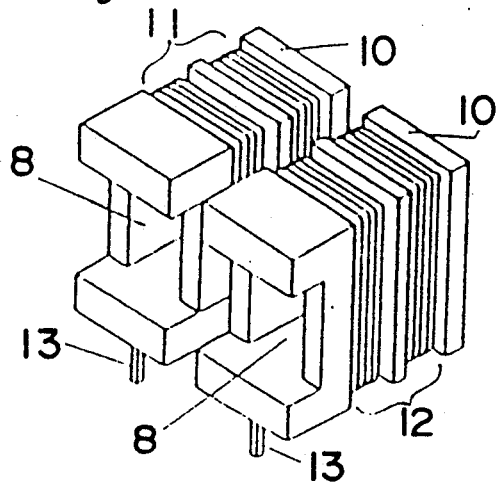
FIG. 8 is a perspective view of the coil bobbin assembly of FIG. 7 bent to form juxtaposed coil bobbins.

Each bobbin assembly is folded 180° inwardly about the respective thin-walled portion 9 as shown in FIG. 8 to allow the first and second coils 11 and 12, or the third and fourth coils 14 and 15, to be juxtaposed relative to each other. While the first and second bobbins 10 having the first and second coils 11 and 12 are juxtaposed to each other as shown in FIG. 8, a generally U-shaped first core member 17 having a pair of arms is mounted on the juxtaposed bobbins 10 with the arms thereof inserted into the respective hollows 8 in the bobbins 10 with the first and second coils 11 and 12 thereby to complete a first coil unit. Similarly, while the first and second bobbins 10 having the third and fourth coils 14 and 15 are juxtaposed to each other in a manner similar to that shown in FIG. 8, a generally U-shaped second core member 17 having a pair of arms is mounted on the juxtaposed bobbins 10 with the arms thereof inserted into the respective hollows 8 in the bobbins 10 with the third and fourth coils 14 and 15 thereon thereby to complete a first coil unit.

Thereafter, the first and second coil units are coupled with each other, with the arms of the first core member 17 abutted end-to-end with the arms of the second core member 17, by means of a generally U-shaped elastic metal clamp 18 that tightly embraces the first and second core members 17 together as shown in FIG. 5, thereby completing the line filter assembly with the first and second core members 17 defining a closed magnetic circuit. It is to be noted that the elastic metal clamp 18 is preferably made of stainless steel and that each of the first and second core members 17 is made of ferrite. It is also to be noted that each of the first and second coils 11 and 12 and each of the third and fourth coils 14 and 15 should be so arranged and so positioned that the directions of flow of magnetic fluxes developed in the respective core members 17 as a result of flow of line currents counteract to each other whereas the first and second coils 11 and 12 and the third and fourth coils 14 and 15 should be so arranged and so positioned that the directions of flow of magnetic fluxes developed in the respective core members 17 as a result of flow of the line currents can remain the same with respect to each other.

In the line filter assembly of the construction described hereinabove, a leakage inductance brought about by a leakage of the magnetic fluxes from the core members 17 to the outside thereof caused by each of the coils 11 and 12, 14 and 15 is rendered to be 1 to 1.5% of the inductance of each of the coils 11 and 12, 14 and 15, which is of a value lower than one half of that of the prior art line filter assembly Because of this, a magnetic saturation of the core material resulting from the line current can hardly take place and the line filter assembly can be manufactured of a size 20 to 30% smaller than that of the prior art line filter assembly for a given inductance with the same line current.

Figure 9:
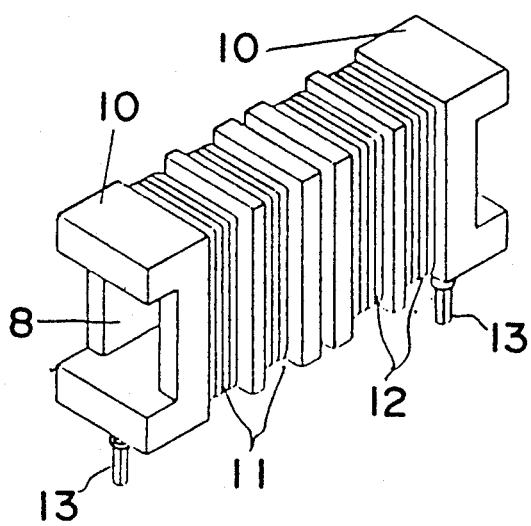
FIG. 9 is a view similar to FIG. 7, showing a modified form of the coil bobbin assembly.

The multi-linked winding bobbin assembly employed in the line filter assembly according to the foregoing embodiment may be modified as shown in FIG. 9. In the example shown in FIG. 9, the multi-linked winding bobbin assembly comprises first and second bobbin units. Each of those first and second bobbin units comprises first and second bobbins 10 around which the first and second coils 11 and 12, or the third and fourth coils 14 and 15, respectively, are wound in a manner similar to those shown and described in connection with the foregoing embodiment of the present invention. They are then bent or folded 180° inwardly and are subsequently accommodated within the casing 16 to complete the line filter assembly.

Figure 10:
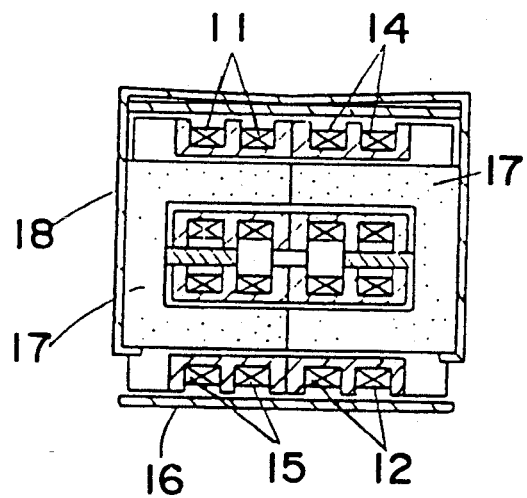
FIG. 10 is a sectional view of the line filter assembly utilizing the coil bobbin assembly of FIG. 9.

Also, as shown in FIG. 10, the first and second bobbins 10 having the first to fourth coils 11 to 14 turned therearound may be housed within the casing 16 such that the first and second coils 11 and 12 can be positioned diagonally opposite to each other while the third and fourth coils 13 and 14 can be diagonally opposite to each other. In such case, the resultant line filter assembly can exhibit the leakage inductance within the range of 0.7 to 1% of the inductance of each of the coils 11 and 12, 14 and 15, and can be manufactured in a size 20 to 30% smaller than that of the prior art line filter assembly for a given inductance with the same line current.

Figure 11:
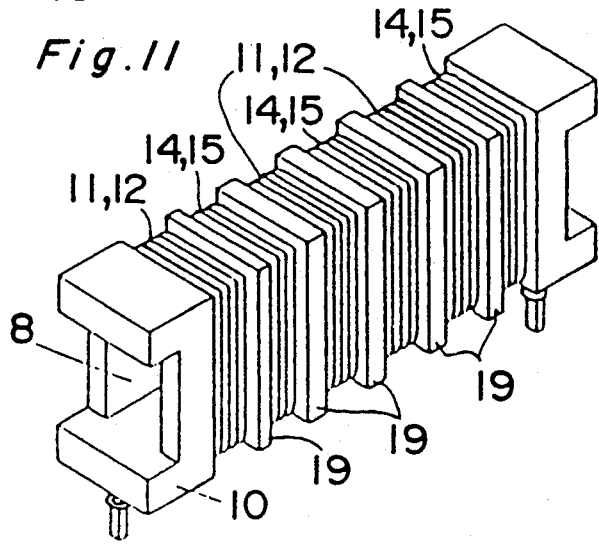
FIG. 11 is a view similar to FIG. 7, showing a further modified coil bobbin assembly.
Figure 12:
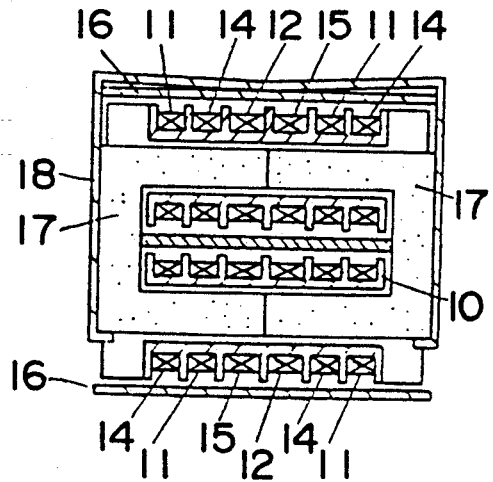
FIG. 12 is a sectional view of the line filter assembly utilizing the coil bobbin assembly of FIG. 11.

The line filter assembly according to the foregoing embodiment of the present invention may be also modified as shown in FIGS. 11 and 12. According to the modification shown in FIG. 11, a first multi-linked winding bobbin 10 having the hollow 8 defined therein and also having a plurality of radially outwardly flanged collars 19 has coils 11, 12 and 14, 15 alternately turned therearound over the entire length thereof, and another similar second multi-linked winding bobbin 10 having the hollow 8 defined therein and also having a plurality of radially outwardly flanged collars 19 has coils 11, 12 and 14, 15 similarly alternately turned therearound. The first and second winding bobbins 10 having the coils thereon are juxtaposed with each other by means of generally U-shaped core members 17 having respective pairs of arms which are inserted into the respective hollows 8 of the first and second winding bobbins 10 and are connected together by means of an elastic metal clamp 10 used to embrace the first and second winding bobbins 10 together as shown in FIG. 12, so as to thereby complete the line filter assembly. It is to be noted that the number of turns of the coils 11 and 12 is chosen to be equal to that of the coils 14 and 15, but the coils 11 and 12 are wound in a direction counter to the direction of turn of the coils 14 and 15. In the modified line filter assembly of the construction shown in FIGS. 11 and 12, the leakage inductance brought about by a leakage is found to be about 0.5 to 0.8% of the inductance of any one of the coils 11, 12, 14 and 15 and, therefore, the modified line filter assembly can be assembled in a size 40 to 50% smaller than that of the prior art line filter assembly.

While in the foregoing embodiment of the present invention, reference has been made to the use of the elastic metal clamp for clamping the generally U-shaped core members 17 together to complete the line filter assembly with the arms of the core members 17 inserted into the hollows 8 of the bobbins 10, the use may be made of a generally □-shaped core member (a core member in the form of a generally rectangular frame) forming a closed magnetic circuit and, in such case, divided multi-linked winding bobbins are mounted on the core member, followed by a winding of respective wires therearound to complete the line filter assembly. Even this line filter assembly can give similar effects as those afforded by the line filter assembly utilizing the generally U-shaped core members.

According to the first preferred embodiment of the present invention, the line filter assembly can give a reduced leakage inductance resulting from a leakage of the magnetic fluxes, is less susceptible to magnetic saturation of the material for the core member during the flow of the line current and can have an increased number of turn of the coils as compared with those used in the prior art line filter assembly. However, the coils of an increased number of turns tends to emit heat as a result of the flow of the line current and, therefore, the number of turns available is limited by an increase in temperature. This can be substantially suppressed when portions of the line filter assembly where the coils are formed are filled with resinous material such as epoxy resin, silicone resin or urethane resin and it has been found that the temperature increase could be suppressed about 50%. When in the line filter assembly shown in an described with reference to FIGS. 4 to 6 those portions of the line filter assembly exteriorly of the coils are filled with epoxy resin by the use of a dipping method, the size of the resultant line filter assembly could have been reduced further 20 to 30% to exhibit the same inductance at the same temperature increase when the same line current is passed.

Second Embodiment

Figure 13:
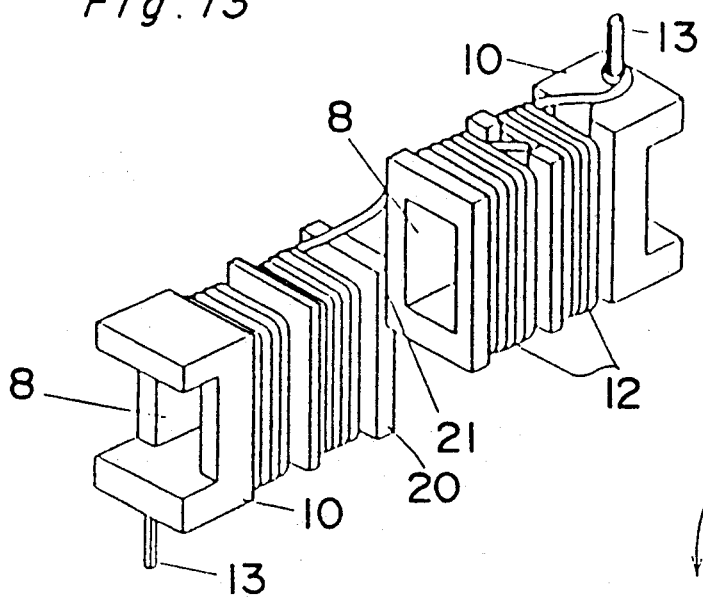
FIG. 13 is a perspective view of coil bobbins used in the line filter assembly according to a second preferred embodiment of the present invention.
Figure 14:
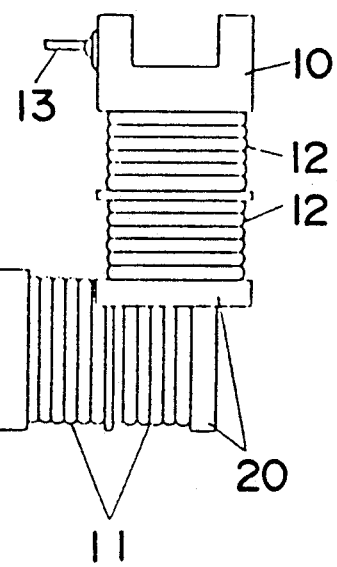
FIG. 14 is a side view of the coil bobbins of FIG. 12, showing how one of the bobbins is rotated relative to the other thereof.
Figure 15:
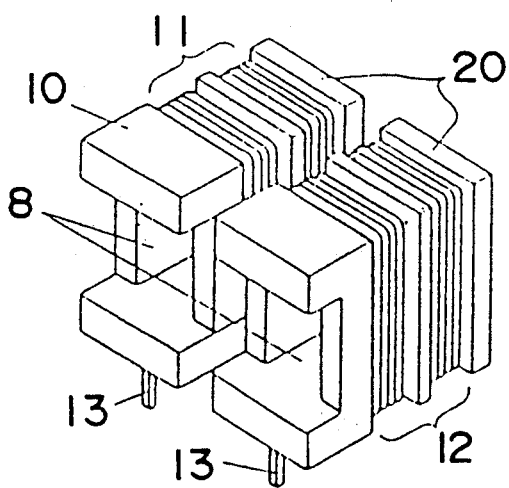
FIG. 15 is a perspective view of the coil bobbins of FIG. 12 juxtaposed in side-by-side fashion with each other.
Figure 16:
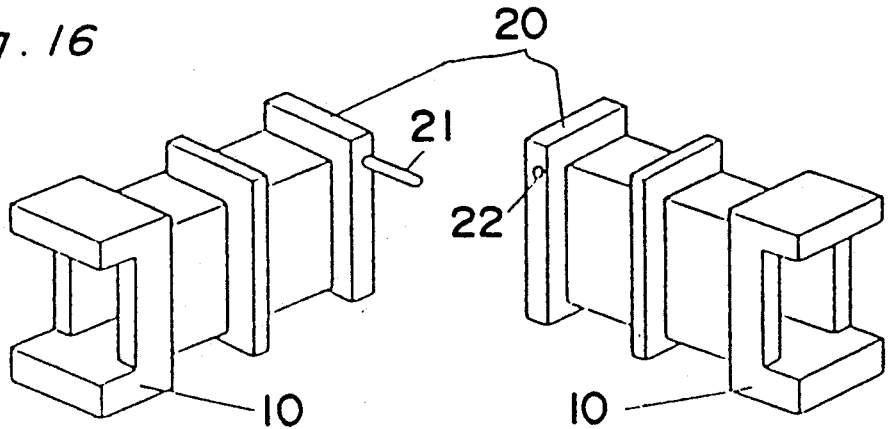
FIG. 16 is an exploded view of the coil bobbins of FIG. 13.

The line filter assembly according to a second preferred embodiment of the present invention is shown in FIGS. 13 to 16. FIG. 13 is a perspective view of a bobbin assembly used in the practice of the second preferred embodiment of the present invention; FIG. 14 is a side view of the bobbin assembly of FIG. 13; FIG. 15 is a perspective view of the first and second bobbins juxtaposed to each other; and FIG. 16 is an exploded view of the bobbin assembly shown in FIG. 13.

A bobbin assembly shown in FIG. 13 and made of synthetic resin comprises first and second bobbins 10 which have respective hollows 8 defined therein and also have radially outwardly extending end flanges 20 each having no metal terminal. Those bobbins 10 are pivotally linked together by means of a connecting pin 21 having its opposite ends secured to the respective end flanges 20 so that one of the bobbins 10 can pivot relative to the other of the bobbins 10. While the bobbins 10 are held substantially in line with each other, a copper wire having its peripheral surface coated with an electrically insulating material is wound around the first bobbin 10 so as to extend from one end of the first bobbin 10 towards the end flange 20 thereof to form the first coil 11 on the first bobbin 10 and then from the end flange 20 of the second bobbin 10 towards the opposite end thereof thereby to form the second coil 12 on the second bobbin 10. The copper wire so wound around the bobbins 10 has its opposite ends soldered to respective metallic terminal members 13 secured rigidly to the first and second bobbins 10.

Third and fourth coils 14 and 15 are also formed on another bobbin assembly of similar construction in a similar manner as shown in FIG. 13. However, the direction of turn of the copper wire used to form the third and fourth coils 14 and 15 must be opposite to the direction of turn of the copper wire used to form the first and second coils 11 and 12, while the total number of turns of the third and fourth coils 14 and 15 is equal to that of the first and second coils 11 and 12.

One of the first and second bobbins 10 having the first and second coils 11 and 12 formed respectively thereon and connected together by means of the connecting pin 21 is rotated relative to the other of the first and second bobbins 10 in a direction shown by the arrow in FIG. 14 so that the first coil 11 can be brought to a position juxtaposed to the second coil 12 as shown in FIG. 15. Then, the arms of the generally U-shaped first core member 17 and the arms of the generally U-shaped second core member 17 are inserted into the respective hollows 8 of the first and second bobbins 10 from opposite directions until free ends of the arms of the first core member 17 are brought into abutment with free ends of the arms of the second bore member 17 within the hollows of the first and second bobbins 10, thereby completing the first and second coil units. Thereafter, the first and second coil units are clamped together by means of the elastic metal clamp 18 that embraces the first and second core members 17 together. The assembly is then enclosed in a casing 16, thereby completing the line filter assembly.

Figure 17:
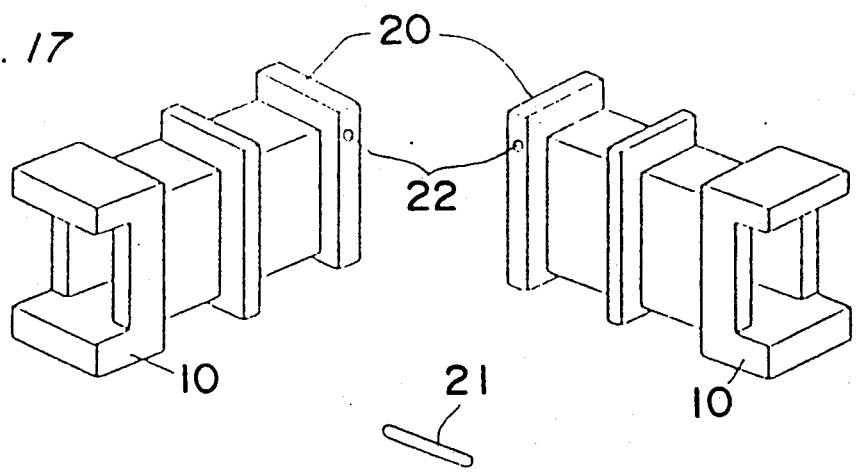
FIG. 17 is a view similar to FIG. 17, showing a modified form of the coil bobbins.

In the practice of the second embodiment of the present invention, during the formation of the first and second bobbins 10 by the use of a plastics molding technique, the connecting pin 21 is integrally formed with one of the first and second bobbins 10 while a socket 22 for receiving a free end of the connecting pin 21 is formed in the other of the first and second bobbins 10 as shown in FIG. 16, so that the first and second bobbins 10 can be connected together by means of the connecting pin 21 for rotation relative to each other. Alternatively, as a modified form, the first and second bobbins 10 may be formed with respective sockets 22 as shown in FIG. 17 so that the first and second bobbins 10 can be subsequently connected together by means of a separate connecting pin 21, which may be made of synthetic resin, ceramics or metal, so that one of the first and second bobbins 10 can rotate relative to the other of the first and second bobbins 10.

In either case, after the first and second bobbins 10 have been juxtaposed in side-by-side fashion as shown in FIG. 15, the arms of the core members 10 are inserted into the respective hollows in the first and second bobbins 10 from opposite directions to complete the first and second coil units which are subsequently clamped together by means of the elastic metal clamp 18 thereby to complete the line filter assembly. At this time, each of the first and second coils 11 and 12 and each of the third and fourth coils 14 and 15 should be so arranged and so positioned that the directions of flow of magnetic fluxes developed in the respective core members 17 as a result of flow of line currents counteract to each other whereas the first and second coils 11 and 12 and the third and fourth coils 14 and 15 should be so arranged and so positioned that the directions of flow of magnetic fluxes developed in the respective core members 17 as a result of the flow of the line currents can remain the same with respect to each other.

Since during the fabrication the first and second bobbins 10 are rotatably connected together, the line filter assembly according to the second embodiment of the present invention is substantially free from a problem associated with the presence of fins which would be formed if the first and second bobbins are folded about the thin-walled portion such as employed in the first embodiment of the present invention and, therefore, the assembly can be beautifully accommodated within the casing 16 without requiring an increase in number of the manufacturing steps. In addition, since the first and second bobbins 10 remains connected even after they have been accommodated within the casing 16, the physical strength of the complete line filter assembly can be increased advantageously. Also, the storage of the bobbins 10 after the coils have been formed thereon can be easily accomplished with no coils being loosened.

Third Embodiment

A third preferred embodiment of the present invention will now be described with reference to FIGS. 18 and 19 which show a perspective view, with a portion cut away, of the line filter assembly and an exploded view of the bobbin assembly used in the line filter assembly of FIG. 18, respectively.

Figure 18:
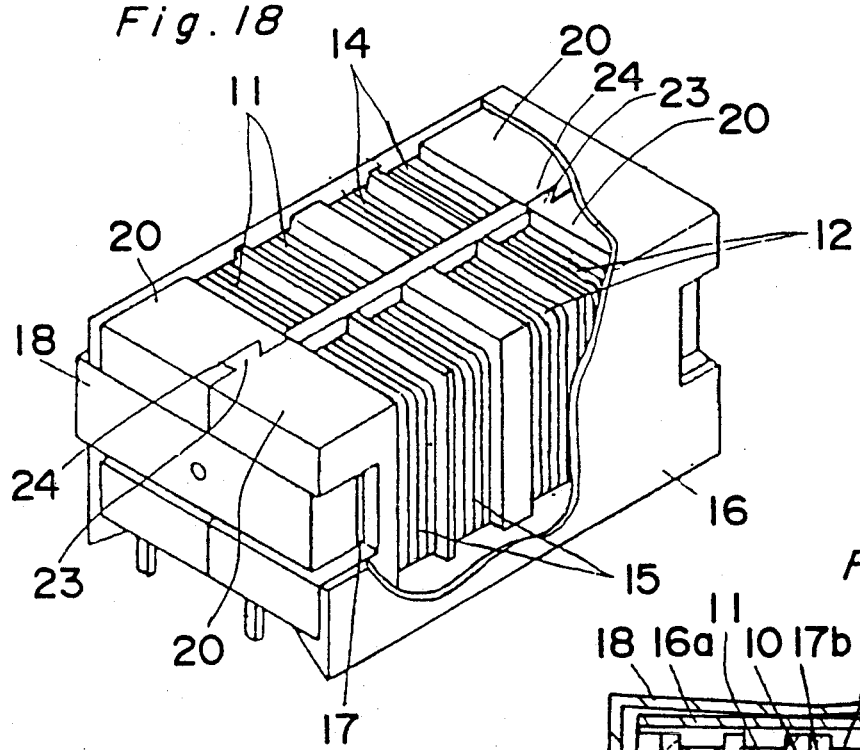
FIG. 18 is a perspective view, with a portion cut away, of the line filter assembly according to a third preferred embodiment of the present invention.
Figure 19:
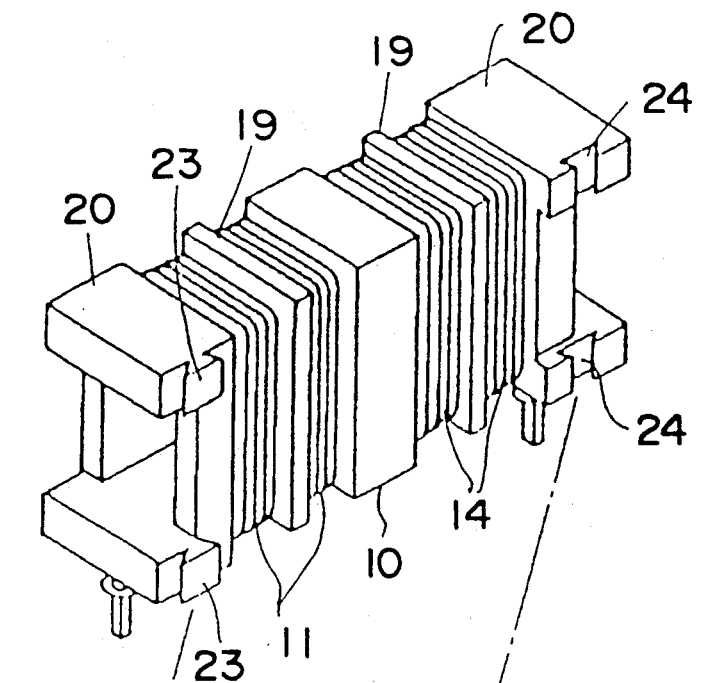
FIG. 19 is an exploded view of the coil bobbins used in the line filter assembly of FIG. 18.
Figure 19:
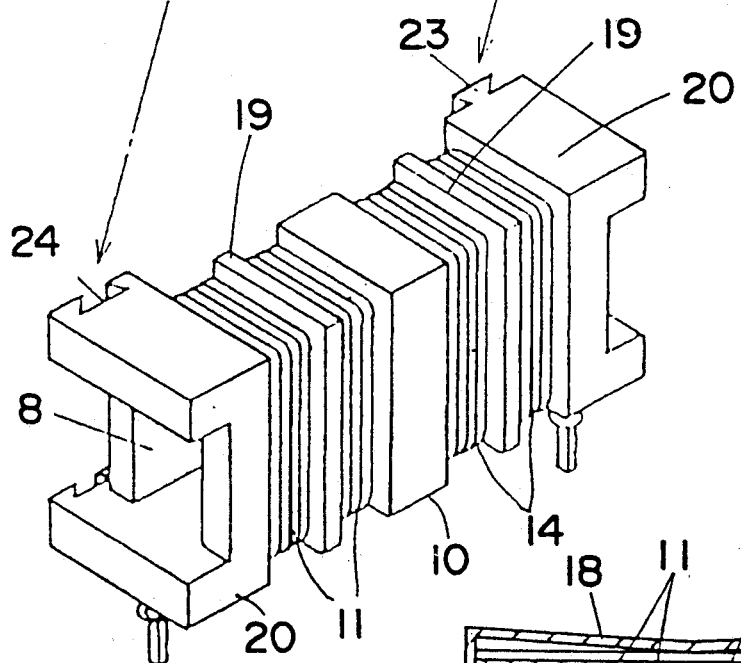

The bobbin assembly shown in FIG. 18 and made of synthetic resin comprises two bobbins 10 which have respective hollows 8 defined therein. Each of the bobbins 10 has a plurality of radially outwardly flanged collars 20 formed integrally therewith at its opposite ends and also at a generally intermediate portion thereof. A copper wire having its peripheral surface coated with an electrically insulating material is wound around one of the bobbins 10 so as to extend from one end collar 20 thereof towards the intermediate collar 20 thereof to form the first coil 11 on such one of the bobbins 10 with opposite ends of the copper wire soldered to terminals 13 fast with the bobbin 10 while another similar copper wire is wound around such one of the bobbins 10 so as to extend from the intermediate collar 20 towards the opposite end collar 20 thereof thereby to form the third coil 14 on such one of the bobbins 10 with opposite ends soldered to terminals 13 fast with the bobbin 10.

Second and fourth coils 12 and 15 are also formed on the other of the bobbins 10 in a similar manner. However, the direction of turn of the copper wire used to form the third and fourth coils 14 and 15 must be opposite to the direction of turn of the copper wire used to form the first and second coils 11 and 12, while the total number of turns of the third and fourth coils 14 and 15 is equal to that of the first and second coils 11 and 12.

In order for the bobbins 10 to be connected together in side-by-side fashion, the end collars 20 of one of the bobbins 10 is formed with a dovetail projection 23 and a dovetail groove 24, respectively, whereas the end collars 20 of the other of the bobbins 10 is formed with a dovetail groove 24 and a dovetail projection 23, respectively. Accordingly, after the formation of the coils 11 and 14 on one of the bobbins 10 and of the coils 12 and 15 on the other of the bobbins 10, the bobbins 10 are connected together in side-by-side fashion with each other with the dovetail projections 23 engaged in the dovetail grooves 24 so as to form respective dovetail joints.

After the bobbins 10 with the coils thereon have been connected together by means of the dovetail joints, the arms of the generally U-shaped first core member 17 and the arms of the generally U-shaped second core member 17 are inserted into the respective hollows 8 of the bobbins 10 from opposite directions until free ends of the arms of the first core member 17 are brought into abutment with free ends of the arms of the second bore member 17 within the hollows 8 of the bobbins 10. Thereafter, the first and second core members 17 are clamped together by means of the elastic metal clamp 18 that embraces them. The assembly is then enclosed in the casing 16, thereby completing the line filter assembly. At this time, each of the coils 11 and 12 and each of the third and fourth coils 14 and 15 should be so arranged and so positioned that the directions of flow of magnetic fluxes developed in the respective core members 17 as a result of flow of line currents counteract to each other whereas the first and second coils 11 and 12 and the third and fourth coils 14 and 15 should be so arranged and so positioned that the directions of flow of magnetic fluxes developed in the respective core members 17 as a result of flow of the line currents can remain the same with respect to each other.

According to the third embodiment of the present invention, the bobbins 10 having the coils thereon are connected together by means of the dovetail joints and, therefore, the use of any bonding agent to connect the bobbins together can be advantageously dispensed with, thereby minimizing the number of manufacturing steps.

Fourth Embodiment

Figure 20:
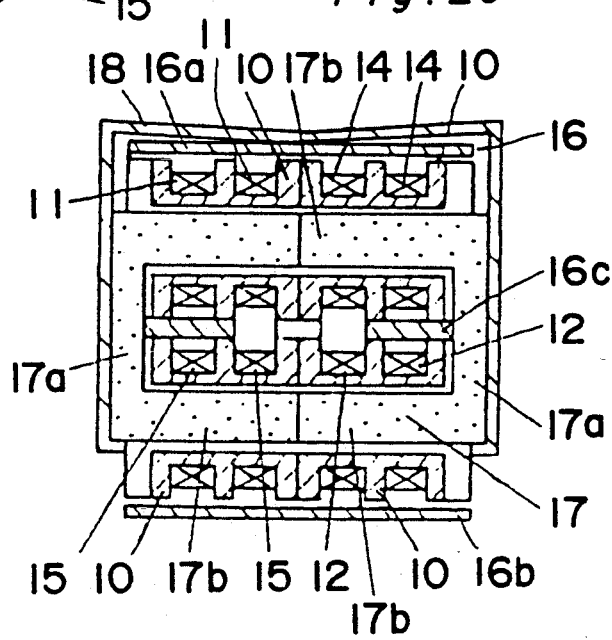
FIG. 20 is a sectional view of the line filter assembly according to a fourth preferred embodiment of the present invention.

The line filter assembly according to a fourth preferred embodiment of the present invention is shown in FIG. 20 in sectional representation. In this line filter assembly, four multi-linked winding bobbins 10 all made of synthetic resin and each having the hollow defined therein are employed, and coils 11, 12, 14 and 15 are formed respectively on those four bobbins 10. Those bobbins 10 are housed within the casing 16 comprised of a pair of side walls 16a and 16b and an intermediate partition wall 16c and, thereafter, the opposite arms 17b of the first and second core members 17 are inserted into the hollows of the bobbins 10 until free ends of the arms 17b of the first core member 17 are brought into abutment with free ends of the arms 17b of the second bore member 17 within the hollows 8 of the bobbins 10. Each of the first and second core members 17 is made of ferrite or the like and is of a type comprising the pair of the opposite arms 17b connected together by means of a bridge 17a, said bridge 17a having a cross-sectional surface area which is $\frac{1}{2}$ to $\frac{3}{4}$ of that of any one of the arms 17b.

Thereafter, the first and second core members 17 are clamped together by means of the elastic metal clamp 18 that embraces them thereby to complete the line filter assembly. It is to be noted that the elastic metal clamp 17 is preferably made of stainless steel and is of a generally U-shaped configuration having a pair of opposite bent fingers 18a engageable respective side portions of the first and second core members 17 to clamp the first and second core members 17 together.

In the assembled condition, the coils 11 and 14 are mounted around one of the arms 17b of the core member 17 while the coils 12 and 15 are mounted around the other of the arms 17b of the core member 17 and, at this time, each of the coils 11 and 12 and each of the third and fourth coils 14 and 15 are so arranged and so positioned that the directions of flow of magnetic fluxes developed in the respective core members 17 as a result of flow of line currents can be counteracted to each other whereas the first and second coils 11 and 12 and the third and fourth coils 14 and 15 are so arranged and so positioned that the directions of flow of magnetic fluxes developed in the respective core members 17 as a result of flow of the line currents can remain the same with respect to each other.

In the construction as hereinabove described, when a line current is allowed to flow across the coils 11 and 12. mounted on the opposed arms 17a of the core members 17 forming the closed magnetic circuit, and also across the coils 14 and 15 mounted on the opposed arms 17b of the same core members 17, the magnetic fluxes passing only through the closed magnetic circuit defined by the core members 17 counteract each other, accompanied by a leakage of the magnetic flux from the opposed arms 17b of the core members 17 into an ambient space exteriorly of the closed magnetic circuit. Accordingly, no magnetic flux is substantially produced in the respective bridges 17a of the first and second core members 17 and, since the average length of the magnetic path defined in the closed magnetic circuit is reduced even though the cross-sectional surface area of each of the bridges 17a of the first and second core members 17 is chosen to be $\frac{1}{2}$ to $\frac{3}{4}$ of that of any one of the arms 17b thereof, an equal inductance can be obtained. Accordingly, a performance comparable to the line filter can be obtained and, also, the volume and the space for installation of the line filter assembly can be reduced about 10 to 20% as compared with a line filter assembly of a type wherein the cross-sectional surface area of each of the bridges of the first and second core members is chosen to be equal to that of any one of the arms thereof.

Fifth Embodiment

Figure 21:
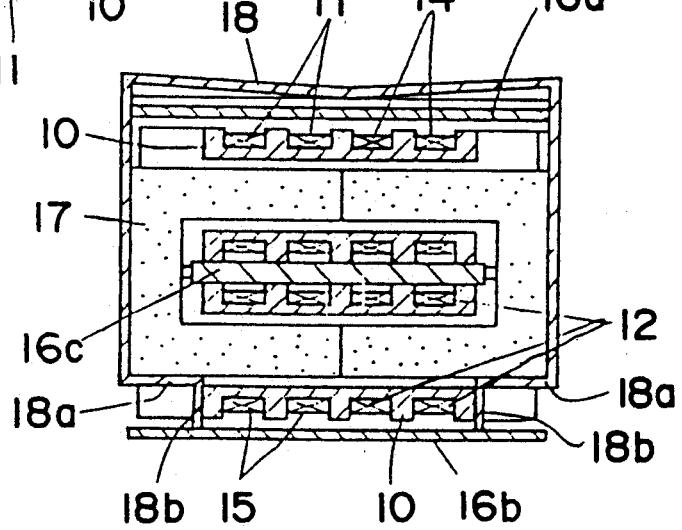
FIG. 21 is a sectional view of the line filter assembly according to a fifth preferred embodiment of the present invention.

The line filter assembly according to a fifth preferred embodiment of the present invention is shown in FIG. 21 in sectional representation and is designed to withstand external vibration to ensure a highly reliable performance.

Referring now to FIG. 21, two multi-linked winding bobbins 10 all made of synthetic resin and each having the hollow defined therein are employed, and coils 11 and 14 are formed on one of the bobbins 10 while the coils 12 and 15 are formed on the other of the bobbins 10. Those bobbins 10 are housed within the casing 16 comprised of a pair of side walls 16a and 16b and an intermediate partition wall 16c and, thereafter, the opposite arms 17b of the first and second core members 17 are inserted into the hollows of the bobbins 10 until free ends of the arms 17b of the first core member 17 are brought into abutment with free ends of the arms 17b of the second bore member 17 within the hollows 8 of the bobbins 10. Each of the first and second core members 17 is made of ferrite or the like and is of a type comprising the pair of the opposite arms 17b connected together by means of a bridge 17a to render the respective core member 17 to represent a generally U-shaped configuration.

Thereafter, the first and second core members 17 are clamped together by means of the elastic metal clamp 18 that embraces them so as to thereby complete the line filter assembly. It is to be noted that the elastic metal clamp 17 is preferably made of stainless steel and is of a generally U-shaped configuration having a pair of opposite bent fingers 18a engageable respective side portions of the first and second core members 17 to clamp the first and second core members 17 together and also having a bent tip 18b continued from each finger 18a so as to extend perpendicular thereto. The bent end 18b integral with each finger 18a of the elastic metal clamp 18 is so designed and so dimensioned that the tip thereof can be brought into engagement with an inner surface of the side wall 16b of the casing 16 while the bent end 18b itself is held in contact with a corresponding one of the opposite ends of the bobbin 10.

In this construction, in the event that external vibration is applied to the line filter assembly constructed as shown in FIG. 21, the ends 18b of the respective fingers 18a of the elastic metal clamp 18 cooperate with the side walls of the casing 16 and the adjacent ends of the bobbin 10 to absorb the vibration so as to thereby avoid any possible collision between the core members 17 and the bobbins 10. Accordingly, not only damage to the closed magnetic circuit defined by the core members 17, but also any possible reduction in magnetic permeability can be advantageously avoided to enable the resultant line filter assembly to operate in a stabilized and reliable manner.

Figure 22:
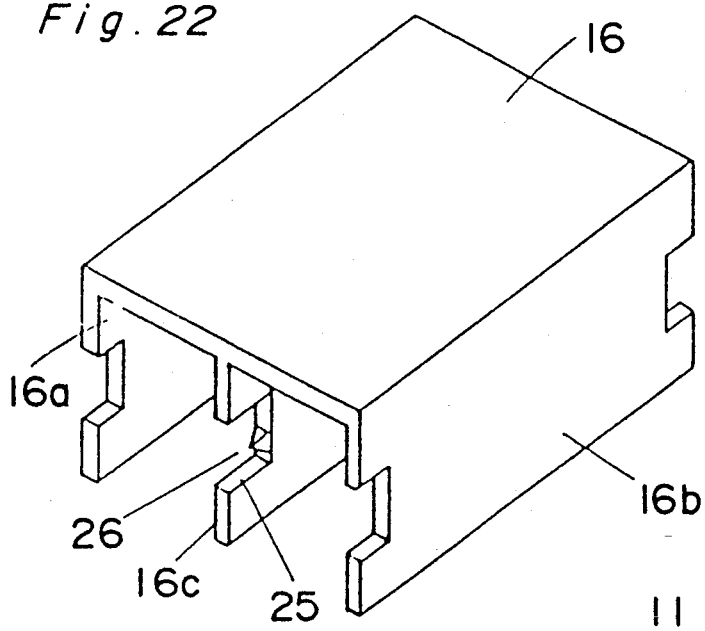
FIG. 22 is a perspective view of a casing used in the line filter assembly of FIG. 21.

The casing 16 used in the line filter assembly may be modified as shown in FIG. 22. The casing 16 shown in FIG. 22 comprises the pair of the side walls 16a and 16b and the partition wall 16c positioned intermediate between the side walls 16a and 16b. The partition wall 16c has its opposite ends formed with respective core guide recesses 25, a bottom face of each of said core guide recesses 25 having a deformable projection 26 formed integrally therewith. The deformable projection 26 in each of the core guide recesses 25 is capable of being deformed in contact with the associated bridge 17a of each of the core members 17 when the elastic metal clamp 18 is encircled to clamp the core members 17 together. To cause the closed magnetic circuit, defined by the core members 17, to be sandwiched between the elastic metal clamp 18 and the deformable projections 26 is effective to substantially eliminate any possible rattling of some component parts of the line filter assembly which would occur during and after the assembly thereof and also to eliminate the need of use of any bonding agent, so as to thereby avoid a reduction in performance and to improve the reliability.

The size of each of the deformable projection 26 in the partition wall 16c of the casing 16 is selected so as to be of a value which is greater than the difference between the maximum size thereof available or permissible within the tolerance in dimension of the core members 17, forming the closed magnetic circuit, and the minimum size thereof available or permissible within the tolerance in dimension of the partition wall 16c of the casing 16 and, also, as to be of such a value that the limit in size thereof attainable by the respective deformable projection 26 when deformed can be smaller than the difference between it and the maximum size thereof available or permissible within the tolerance in dimension of the core members 17 forming the closed magnetic circuit. However, it is to be noted that, instead of the use of the deformable projections 26 in the paction wall 16c of the casing, the casing 16 may be either integrally formed with thin-walled portions during the molding of the casing 16 or fitted with cushioning elements, such as silicone rubber pieces, subsequent to the molding of the casing.

Sixth Embodiment

A sixth preferred embodiment of the present invention will now be described with reference to FIGS. 23 and 24.

Figure 23:
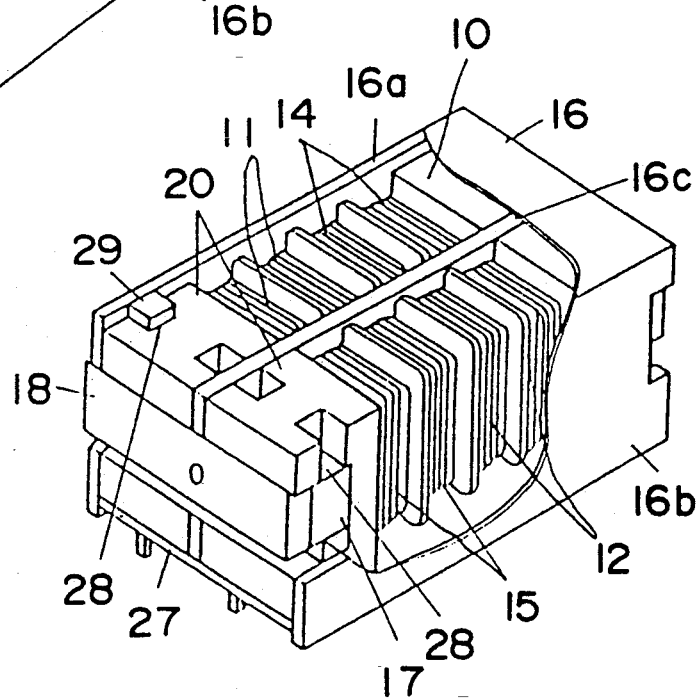
FIG. 23 is a perspective view, with a portion cut away, of the line filter assembly according to a sixth preferred embodiment of the present invention.

The bobbin assembly shown in FIG. 23 and made of synthetic resin comprises two bobbins 10 which have respective hollows 8 defined therein. Each of the bobbins 10 has a plurality of radially outwardly flanged end collars 20 formed integrally therewith at its opposite ends and also a plurality of radially outwardly flanged intermediate collars 19 at a generally intermediate portion thereof. The coils 11 and 14 are formed on one of the bobbins 10 and the coils 12 and 15 are formed on the other of the bobbins 10. The bobbins 10 with the coils 11, and 14 and 12, and 15 mounted thereon respectively are subsequently housed within the casing 16 of a generally E-shaped cross-section, followed by a fitting of a bottom plate 27 to the casing 16. Thereafter, the arms of the generally U-shaped first core member 17 and the arms of the generally U-shaped second core member 17 are inserted into the respective hollows 8 of the bobbins 10 from opposite directions until free ends of the arms of the first core member 17 are brought into abutment with free ends of the arms of the second bore member 17 within the hollows 8 of the bobbins 10. The first and second core members 17 are subsequently clamped together by means of the elastic metal-clamp 18 that embraces them.

In this embodiment, each of the end collars 20 of each of the bobbins 10 has its opposite sides formed with respective engagement grooves 28 which open towards the side walls 16a and 16b and the partition wall 16c of the casing 16. On the other hand, a portion of each of the side walls 16 and 16b and the partition wall 16c of the casing 16, which confronts the associated engagement groove 28 in the corresponding end collar 20 is formed with an engagement rib 29 which is engageable into the associated engagement groove 28 as the assembly of bobbins 10 with coils thereon is housed within the casing 16.

Also, respective lower edges of the side walls 16a and 16b of the casing 16 are formed with retainer pawls 31 for retaining in position the multi-linked bobbins 10. The side walls 16a and 16b of the casing 16 is further formed with hook pawls 31 which can be snapped into respective detent holes defined in the bottom plate 27 to secure the latter to the casing 16 with the filter assembly housed therein in the form as sandwiched between the casing 16 and the bottom plate 27.

Figure 24:
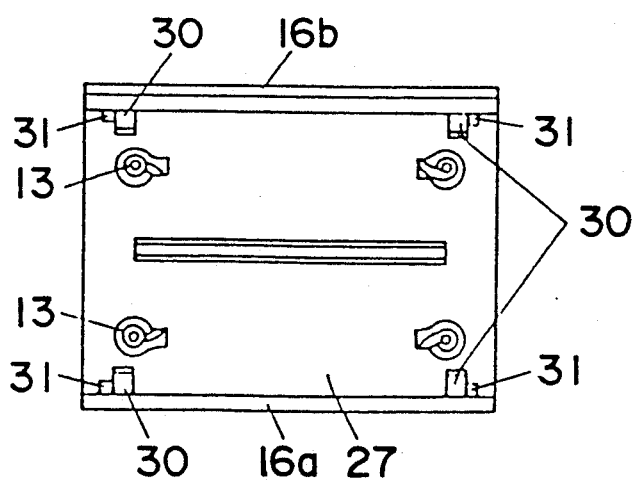
FIG. 24 is a bottom plane view of the line filter assembly of FIG. 23.

The system shown in FIGS. 23 and 24 is advantageous in that no bonding agent is employed to fix the component parts in position, thereby minimizing the number of manufacturing steps and that the component parts can be tightly fixed in position within the casing so as to thereby improve the reliability considerably.

From the foregoing description of the preferred embodiments of the present invention, it is clear that substantial portion of magnetic leakage fluxes from one of the coils and also from the other of the coils can be counterbalanced to make a magnetic saturation difficult to occur. Also, the core members forming the closed magnetic circuit may be small in size for the resultant line filter assembly to operate with the same line current to give the same inductance and, therefore, the line filter assembly as a whole can be manufactured compact in size, low in height and at a reduced manufacturing cost. Also, any possible influence which may be brought by the line filter assembly on peripheral component parts can be minimized. Thus, the present invention has a significant utility.

What is claimed is:

1. A line filter assembly which comprises:

a magnetic core means forming a closed magnetic circuit and including first and second arm means opposite to each other;

a first coil means having at least a first portion thereof wound around the first arm means and having at least a second portion wound around the second arm means;

a second coil means having at least a first portion wound around the first arm means and having at least a second portion wound around the second arm means; and said portions of said first and second coil means being disposed such that directions of magnetic fluxes produced in the closed magnetic circuit as a result of flow of line currents counteract while portions of the same coil means are so arranged that the magnetic fluxes produced in the closed magnetic circuit as a result of the flow of the line currents are oriented in the same direction.

2. The line filter assembly as claimed in claim 1, wherein one portion of one of the two coil means and another portion of one of the two coil means are positioned diagonally opposite to each other while one portion of one of the two coil means and another portion of one of the two coil means are also positioned diagonally opposite to each other.

3. The line filter assembly as claimed in claim 1, wherein portions the first and second coil means are alternatively wound around the respective arms of the core means.

4. A line filter assembly which comprises:

a magnetic core means forming a closed magnetic circuit and including first and second arm means opposite to each other and connected together through a common bridge means;

a first coil means having at least a first portion thereof wound around the first arm means and having at least a second portion wound around the second arm means;

a second coil means having at least a first portion wound around the first arm means and having at least a second portion wound around the second arm means;

said portions of said first and second coil means being disposed such that directions of magnetic fluxes produced in the closed magnetic circuit as a result of flow of line currents counteract while portions of the same coil means are so arranged that the magnetic fluxes produced in the closed magnetic circuit as a result of the flow of the line currents are oriented in the same direction;

a casing of a generally U-shaped section accommodating an assembly of the magnetic core means having the first and second coil means mounted on the first and second arm means;

a substantially elastic metal clamp of a generally U-shaped configuration exteriorly encircling the casing with free ends thereof engaged with opposite side faces of the magnetic core means.

* * * * *